US012517346B2

(12) United States Patent
Nishiura et al.

(10) Patent No.: US 12,517,346 B2
(45) Date of Patent: Jan. 6, 2026

(54) OPTICAL SCANNING DEVICE AND METHOD OF DRIVING MICROMIRROR DEVICE

(71) Applicant: FUJIFILM Corporation, Tokyo (JP)

(72) Inventors: Yosuke Nishiura, Kanagawa (JP); Takayuki Naono, Kanagawa (JP); Keisuke Aoshima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 381 days.

(21) Appl. No.: 18/348,568

(22) Filed: Jul. 7, 2023

(65) Prior Publication Data

US 2023/0350193 A1 Nov. 2, 2023

Related U.S. Application Data

(63) Continuation of application No. PCT/JP2022/002053, filed on Jan. 20, 2022.

(30) Foreign Application Priority Data

Jan. 27, 2021 (JP) ................................ 2021-011351

(51) Int. Cl.
  *G02B 26/08* (2006.01)
  *G02B 26/10* (2006.01)

(52) U.S. Cl.
  CPC ....... *G02B 26/101* (2013.01); *G02B 26/0858* (2013.01)

(58) Field of Classification Search
  CPC .. G02B 26/101; G02B 26/0858; G02B 26/08; G02B 26/10; G02B 26/105; B81B 3/00; G01S 7/481
  See application file for complete search history.

(56) References Cited

U.S. PATENT DOCUMENTS

| 2012/0243064 A1 | 9/2012 | Tani |
| 2019/0265462 A1 | 8/2019 | Yamada |

(Continued)

FOREIGN PATENT DOCUMENTS

| JP | 2009-9093 A | 1/2009 |
| JP | 2009-223165 A | 10/2009 |

(Continued)

OTHER PUBLICATIONS

Extended European Search Report for corresponding European Application No. 22745722.3, dated Jul. 15, 2024.

(Continued)

*Primary Examiner* — Euncha P Cherry
(74) *Attorney, Agent, or Firm* — Birch, Stewart, Kolasch & Birch, LLP

(57) ABSTRACT

An optical scanning device includes: a micromirror device, a first actuator that allows the mirror portion to swing around a first axis, and a second actuator that allows the mirror portion to swing around a second axis orthogonal to the first axis; and a processor that causes the mirror portion to perform precession by providing a first driving signal and a second driving signal each having the same driving frequency to the first actuator and the second actuator, respectively. In the micromirror device, a relationship of $f_2<f_1$ is satisfied in a case in which a resonance frequency around the first axis is denoted by $f_1$ and a resonance frequency around the second axis is denoted by $f_2$, and a relationship of $f_d \leq f_1$ is satisfied in a case in which the driving frequency is denoted by $f_d$.

8 Claims, 15 Drawing Sheets

(56) References Cited

U.S. PATENT DOCUMENTS

| | | |
|---|---|---|
| 2020/0004011 A1 | 1/2020 | Champion et al. |
| 2020/0271920 A1 | 8/2020 | Hirata et al. |
| 2021/0223539 A1* | 7/2021 | Naono ................. G02B 26/101 |
| 2022/0043256 A1 | 2/2022 | Naono et al. |

FOREIGN PATENT DOCUMENTS

| | | |
|---|---|---|
| JP | 2012-203079 A | 10/2012 |
| JP | 2019-144497 A | 8/2019 |
| KR | 10-2018-0110400 A | 10/2018 |
| WO | WO 2018/230065 A1 | 12/2018 |
| WO | WO 2020/085063 A1 | 4/2020 |
| WO | WO 2020/218585 A1 | 10/2020 |

OTHER PUBLICATIONS

International Preliminary Report on Patentability and Written Opinion of the International Searching Authority (Forms PCT/IPEA/409 and PCT/ISA/237) for International Application No. PCT/JP2022/002053, dated Nov. 18, 2022, with an English translation.

International Search Report (Form PCT/ISA/210) for International Application No. PCT/JP2022/002053, dated Apr. 5, 2022, with English translation.

* cited by examiner

OPTICAL SCANNING DEVICE AND METHOD OF DRIVING MICROMIRROR DEVICE

CROSS-REFERENCE TO RELATED APPLICATION

This application is a continuation application of International Application No. PCT/JP2022/002053, filed Jan. 20, 2022, the disclosure of which is incorporated herein by reference in its entirety. Further, this application claims priority from Japanese Patent Application No. 2021-011351 filed on Jan. 27, 2021, the disclosure of which is incorporated herein by reference in its entirety.

BACKGROUND

1. Technical Field

The technology of the present disclosure relates to an optical scanning device and a method of driving a micromirror device.

2. Description of the Related Art

A micromirror device (also referred to as a microscanner) is known as one of micro electro mechanical systems (MEMS) devices manufactured using the silicon (Si) nanofabrication technique. The micromirror device is driven by a driving controller provided in an optical scanning device. By driving a mirror portion of the micromirror device, the driving controller two-dimensionally scans an object with a light beam reflected by the mirror portion.

An optical scanning method using the micromirror device is superior to an optical scanning method using a polygon mirror in the related art in terms of small size, light weight, and low power consumption. Therefore, application of the micromirror device to a light detection and ranging (LiDAR) device, a scanning beam display, and the like is attracting attention.

Examples of a drive method of the micromirror device include an electrostatic drive method, an electromagnetic drive method, and a piezoelectric drive method. In the piezoelectric drive method, the device has a small size and has a large scan angle because a device structure and a drive circuit are simple while torque is large. The micromirror device resonates at a natural vibration frequency determined by a mass, structure, and spring constant. By driving the micromirror device at the resonance frequency, a larger scan angle is obtained. The scan angle corresponds to a deflection angle of the mirror portion.

WO2018/230065A proposes a piezoelectric biaxial drive type micromirror device that enables precession of a mirror portion. The precession is a motion in which a central axis orthogonal to a reflecting surface of the mirror portion is deflected such that a circle is drawn. In order to cause the mirror portion to perform precession, it is necessary to allow the mirror portion to swing around each of a first axis and a second axis orthogonal to each other at the same frequency. Therefore, WO2018/230065A proposes matching a resonance frequency around the first axis (hereinafter, referred to as a first resonance frequency) with a resonance frequency around the second axis (hereinafter, referred to as a second resonance frequency).

By the precession of the mirror portion, an object to be scanned is scanned with a light beam reflected by the mirror portion such that a circle is drawn. The circular light beam is used, for example, in the LiDAR device.

JP2019-144497A discloses that crosstalk occurs between a first actuator that resonantly driving a mirror portion around a first axis and a second actuator that resonantly driving the mirror portion around a second axis in a piezoelectric biaxial drive type micromirror device. This crosstalk is caused by the fact that propagation of vibration generated in one actuator to the other actuator excites resonance vibration.

SUMMARY

As disclosed in WO2018/230065A, by matching the first resonance frequency with the second resonance frequency and matching frequencies of driving signals provided to first and second actuators with the first resonance frequency and the second resonance frequency, responsiveness of an operation of the mirror portion to the driving signals is improved. However, in a case in which the first resonance frequency is matched with the second resonance frequency, it is considered that there is an adverse effect that the crosstalk disclosed in JP2019-144497A increases.

The present applicant has confirmed that crosstalk is likely to occur in a micromirror device in which the first actuator allows the mirror portion to swing around the first axis and the second actuator allows the first actuator to swing around the second axis together with the mirror portion. Specifically, the present applicant has confirmed that the first resonance frequency shifts according to a deflection angle around the second axis.

In order to cause the mirror portion to perform precession, it is necessary to accurately match a deflection angle around the first axis with a deflection angle around the second axis. However, in a case in which the above-mentioned crosstalk occurs, the first resonance frequency shifts according to the deflection angle around the second axis, so that the deflection angle around the first axis is lowered.

In order to improve the deflection angle, it is conceivable to increase the amplitude voltage of the driving signal. However, in a case in which the amplitude voltage of the driving signal is increased, there is an adverse effect that a drive circuit for driving the micromirror device is increased in size and the power consumption is increased.

An object of the technology of the present disclosure is to provide an optical scanning device that can improve a deflection angle with low power in a case in which a mirror portion performs precession, and a method of driving a micromirror device.

In order to achieve the above-described object, an optical scanning device of the present disclosure comprises: a micromirror device including a mirror portion that has a reflecting surface for reflecting incident light, a first actuator that allows the mirror portion to swing around a first axis located in a plane including the reflecting surface in a case in which the mirror portion is stationary, and a second actuator that allows the mirror portion to swing around a second axis orthogonal to the first axis in the plane; and a processor that causes the mirror portion to perform precession by providing a first driving signal and a second driving signal each having the same driving frequency to the first actuator and the second actuator, respectively, in which, in the micromirror device, a relationship of $f_2 < f_1$ is satisfied in a case in which a resonance frequency around the first axis is denoted by $f_1$ and a resonance frequency around the second axis is denoted by $f_2$, and a relationship of $f_d \leq f_1$ is satisfied in a case in which the driving frequency is denoted by $f_d$.

It is preferable that in a case in which the mirror portion is driven around the first axis and the second axis simultaneously, the resonance frequency around the first axis changes by $\Delta f$ from $f_1$, and that a relationship of $f_1 - \Delta f < f_d$ is satisfied.

It is preferable that a relationship of $\Delta f > 0$ is satisfied.

It is preferable that a relationship of $f_1 - \Delta f < f_d < f_2$ is satisfied.

It is preferable that the first actuator and the second actuator are piezoelectric actuators each including a piezoelectric element.

It is preferable that the first actuator is connected to the mirror portion via a first support portion that swingably supports the mirror portion around the first axis, and that the second actuator is connected to the first actuator via a second support portion that swingably supports the first actuator around the second axis.

It is preferable that each of the first support portion and the second support portion is a torsion bar.

It is preferable that the optical scanning device further comprises a light source that emits a light beam perpendicularly to the reflecting surface in a case in which the mirror portion is stationary.

A method of driving a micromirror device of the present disclosure is a method of driving a micromirror device including a mirror portion that has a reflecting surface for reflecting incident light, a first actuator that allows the mirror portion to swing around a first axis located in a plane including the reflecting surface in a case in which the mirror portion is stationary, and a second actuator that allows the mirror portion to swing around a second axis orthogonal to the first axis in the plane. In the micromirror device, a relationship of $f_2 < f_1$ is satisfied in a case in which a resonance frequency around the first axis is denoted by $f_1$ and a resonance frequency around the second axis is denoted by $f_2$, and a first driving signal and a second driving signal each having a driving frequency $f_d$ satisfying a relationship of $f_d \leq f_1$ are provided to the first actuator and the second actuator, respectively, to cause the mirror portion to perform precession.

According to the technology of the present disclosure, it is possible to provide an optical scanning device that can improve a deflection angle with low power in a case in which a mirror portion performs precession, and a method of driving a micromirror device.

BRIEF DESCRIPTION OF THE DRAWINGS

Exemplary embodiments according to the technique of the present disclosure will be described in detail based on the following figures, wherein.

DETAILED DESCRIPTION

An example of an embodiment relating to the technology of the present disclosure will be described with reference to the accompanying drawings.

Figure 1:
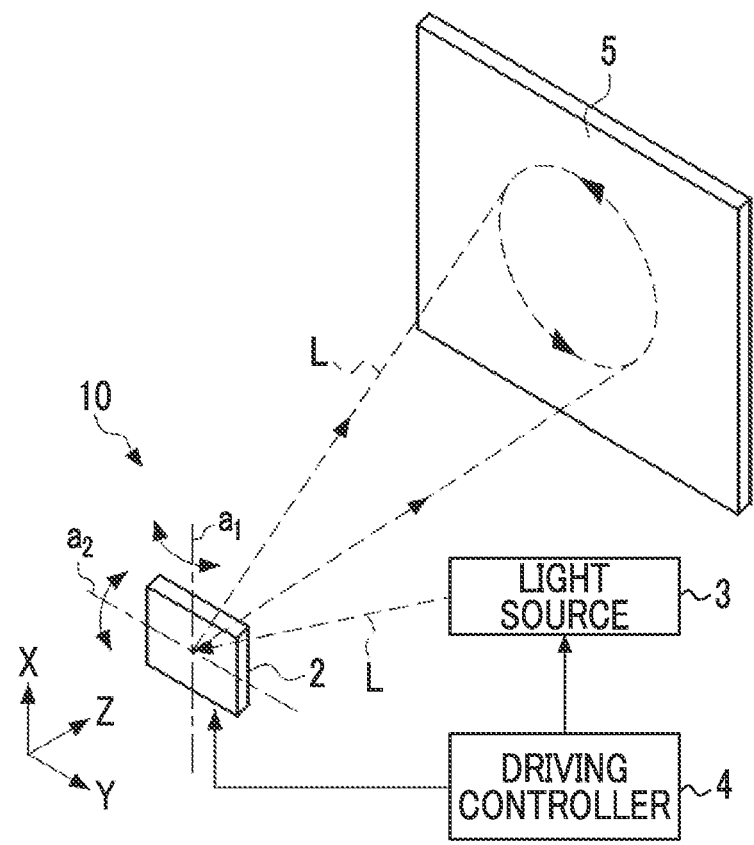
FIG. 1 is a schematic view of an optical scanning device.

FIG. 1 schematically shows an optical scanning device 10 according to an embodiment. The optical scanning device 10 includes a micromirror device (hereinafter, referred to as micromirror device (MMD)) 2, a light source 3, and a driving controller 4. The optical scanning device 10 optically scans a surface to be scanned 5 by reflecting a light beam L emitted from the light source 3 by the MMD 2 under the control of the driving controller 4. The surface to be scanned 5 is, for example, a screen.

The MMD 2 is a piezoelectric biaxial drive type micromirror device capable of allowing a mirror portion 20 (see FIG. 3) to swing around a first axis $a_1$ and a second axis $a_2$ orthogonal to the first axis $a_1$. Hereinafter, the direction parallel to the first axis $a_1$ is referred to as an X direction, the direction parallel to the second axis $a_2$ is a Y direction, and the direction orthogonal to the first axis $a_1$ and the second axis $a_2$ is referred to as a Z direction.

The light source 3 is a laser device that emits, for example, laser light as the light beam L. It is preferable that the light source 3 emits the light beam L perpendicularly to a reflecting surface 20A (see FIG. 3) included in the mirror portion 20 in a state where the mirror portion 20 of the MMD 2 is stationary.

The driving controller 4 outputs a driving signal to the light source 3 and the MMD 2 based on optical scanning information. The light source 3 generates the light beam L based on the input driving signal and emits the light beam L to the MMD 2. The MMD 2 allows the mirror portion 20 to swing around the first axis $a_1$ and the second axis $a_2$ based on the input driving signal.

As will be described in detail below, the driving controller 4 causes the mirror portion 20 to perform precession. By the precession of the mirror portion 20, the surface to be scanned 5 is scanned with the light beam L reflected by the mirror portion 20 such that a circle is drawn on the surface to be scanned 5. The circular light beam L is used, for example, in the LiDAR device.

Figure 2:
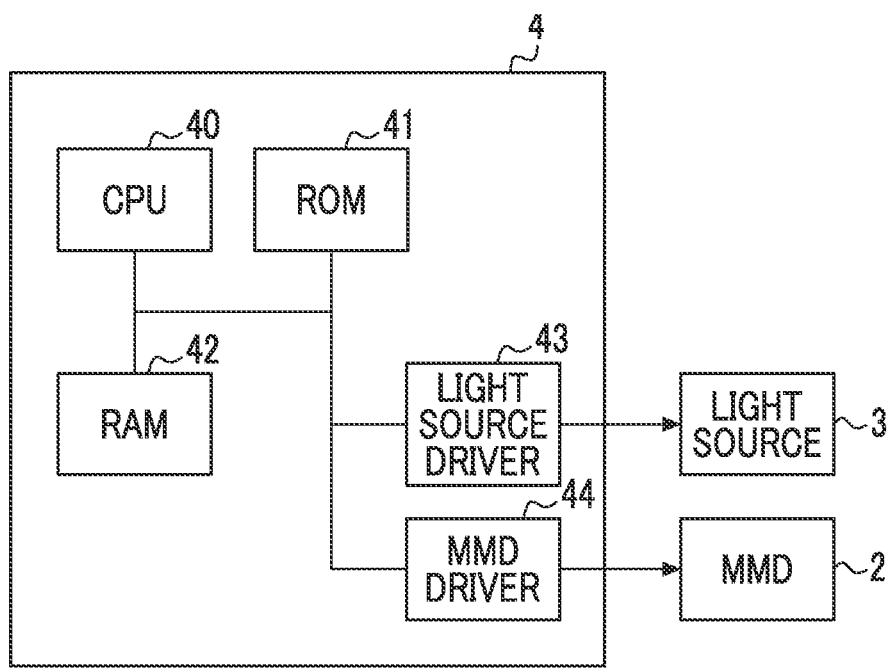
FIG. 2 is a block diagram showing an example of a hardware configuration of a driving controller.

FIG. 2 shows an example of a hardware configuration of the driving controller 4. The driving controller 4 has a central processing unit (CPU) 40, a read only memory (ROM) 41, a random access memory (RAM) 42, a light source driver 43, and an MMD driver 44. The CPU 40 is an arithmetic unit that realizes the entire function of the driving controller 4 by reading out a program and data from a storage device such as the ROM 41 into the RAM 42 and executing processing. The CPU 40 is an example of a "processor" according to the technology of the present disclosure.

The ROM 41 is a non-volatile storage device and stores a program for the CPU 40 to execute processing and data such as the optical scanning information described above. The RAM 42 is a non-volatile storage device that temporarily holds a program and data.

The light source driver 43 is an electric circuit that outputs a driving signal to the light source 3 under the control of the CPU 40. In the light source driver 43, the driving signal is a driving voltage for controlling the irradiation timing and the irradiation intensity of the light source 3.

The MMD driver 44 is an electric circuit that outputs a driving signal to the MMD 2 under the control of the CPU 40. In the MMD driver 44, the driving signal is a driving voltage for controlling the timing, cycle, and deflection angle for allowing the mirror portion 20 of the MMD 2 to swing.

The CPU 40 controls the light source driver 43 and the MMD driver 44 based on the optical scanning information. The optical scanning information is information for indicating how the surface to be scanned 5 is scanned with the light beam L. In the present embodiment, the optical scanning information is information for indicating that the surface to be scanned 5 is scanned with the light beam L such that a circle is drawn on the surface to be scanned 5. For example, in a case in which the optical scanning device 10 is incorporated in the LiDAR device, the optical scanning information includes a time at which the light beam L for distance measurement is emitted, an irradiation range, and the like.

Figure 3:
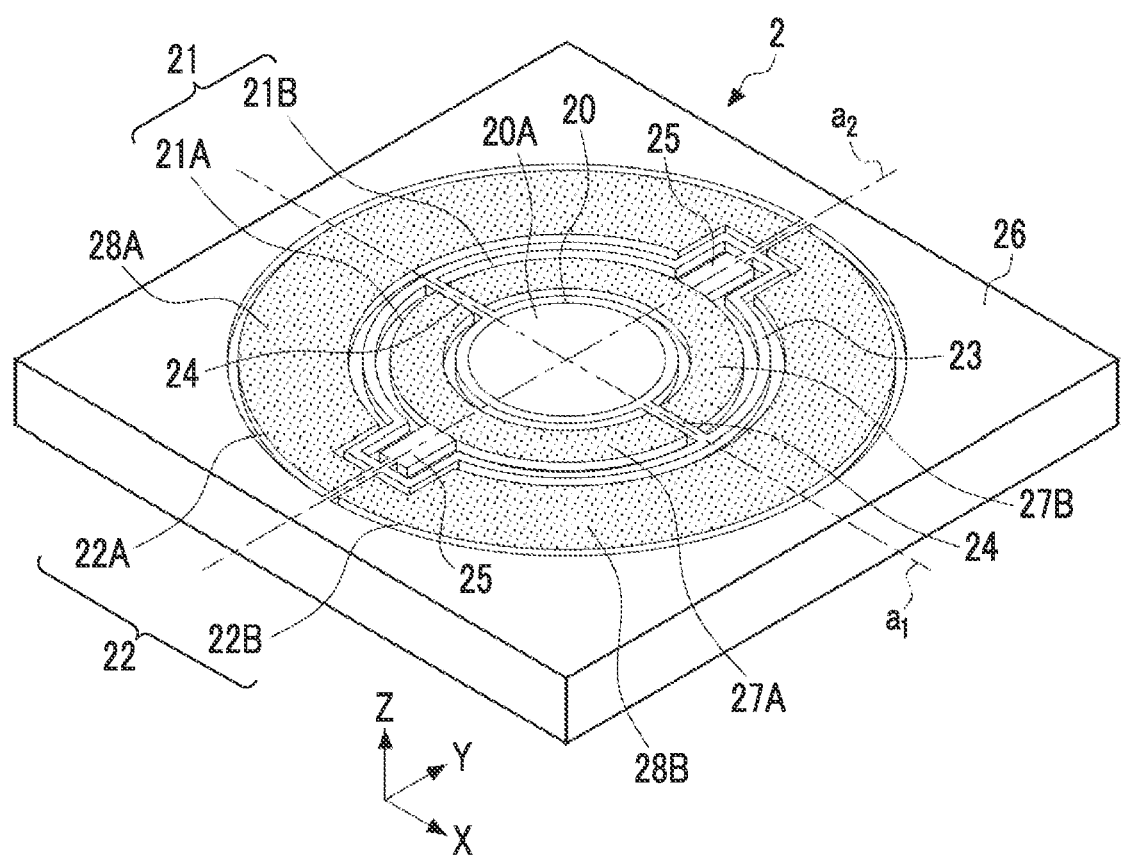
FIG. 3 is an external perspective view of a micromirror device.
Figure 4:
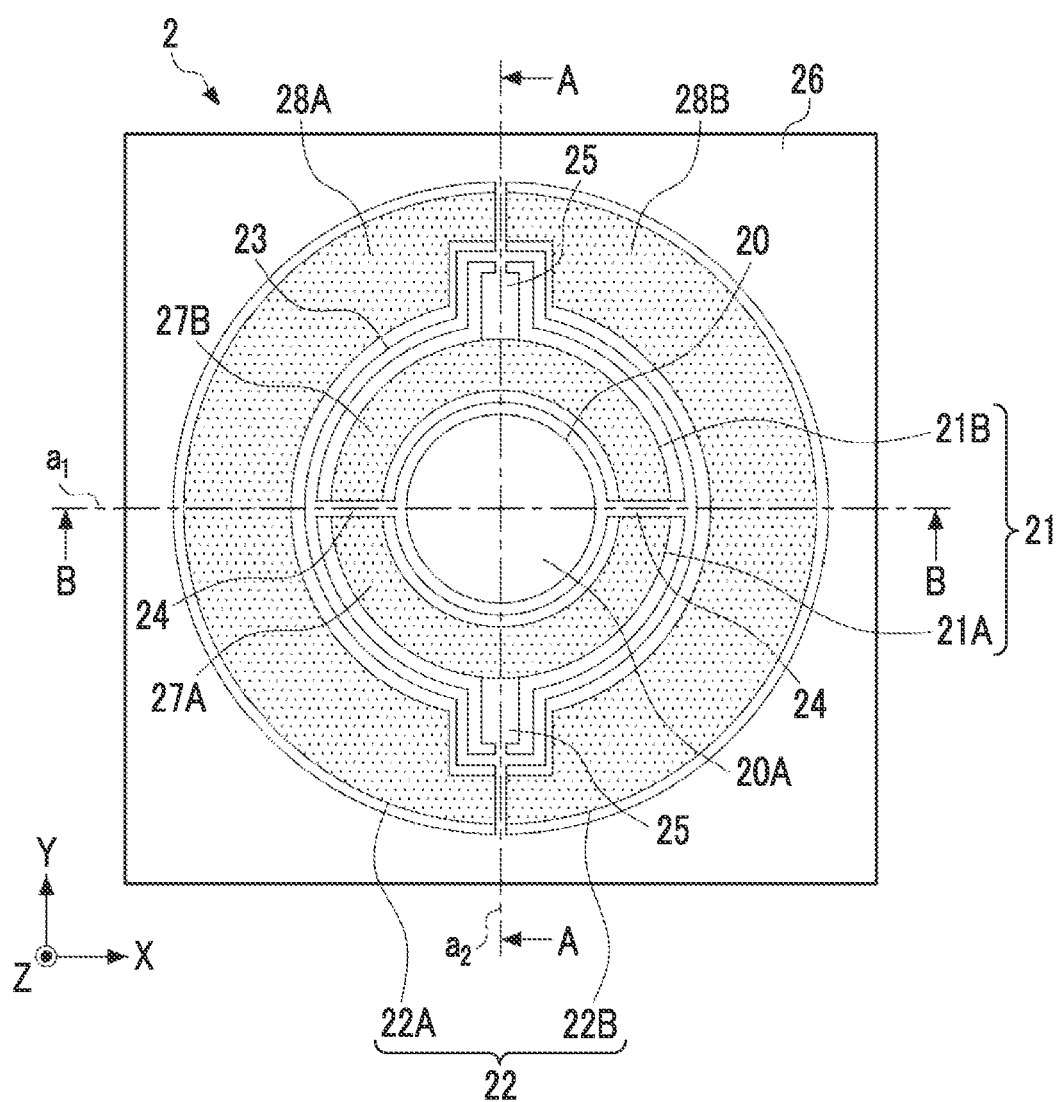
FIG. 4 is a plan view of the micromirror device as viewed from the light incident side.
Figure 5:
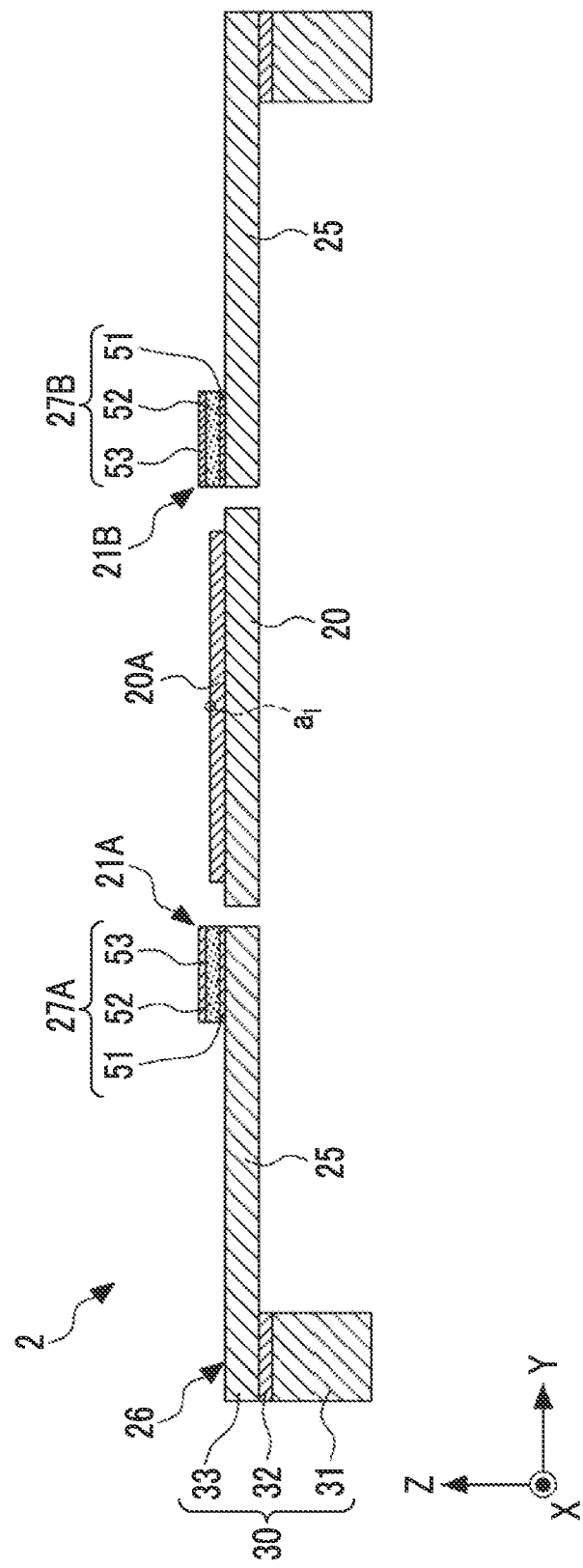
FIG. 5 is a cross-sectional view taken along the line A-A of FIG. 4.
Figure 6:
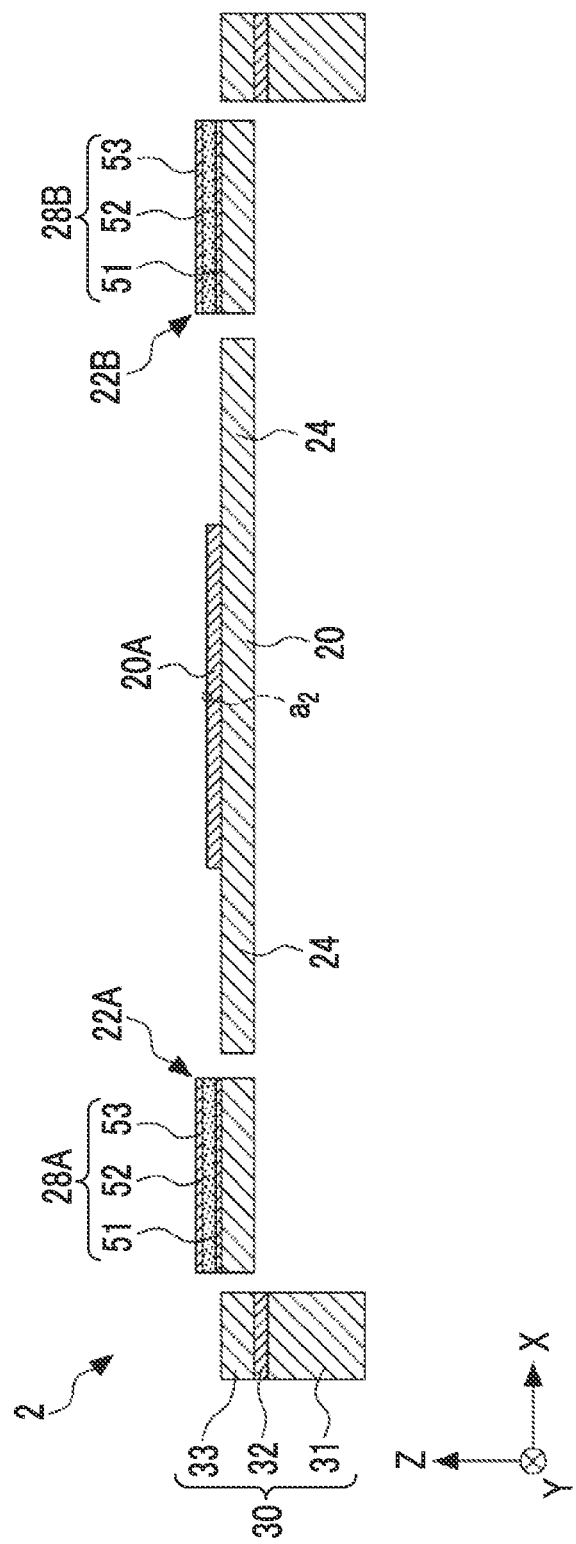
FIG. 6 is a cross-sectional view taken along the line B-B of FIG. 4.

Next, an example of the MMD 2 will be described with reference to FIGS. 3 to 6. FIG. 3 is an external perspective view of the MMD 2. FIG. 4 is a plan view of the MMD 2 as viewed from the light incident side. FIG. 5 is a cross-sectional view taken along the line A-A in FIG. 4. FIG. 6 is a cross-sectional view taken along the line B-B in FIG. 4.

As shown in FIGS. 3 and 4, the MMD 2 has a mirror portion 20, a first actuator 21, a second actuator 22, a support frame 23, a first support portion 24, a second support portion 25, and a fixed portion 26. The MMD 2 is a so-called MEMS device.

The mirror portion 20 has a reflecting surface 20A for reflecting incident light. The reflecting surface 20A is formed of a metal thin film such as gold (Au) and aluminum (Al) provided on one surface of the mirror portion 20. The reflecting surface 20A is, for example, circular.

The first actuator 21 is disposed to surround the mirror portion 20. The support frame 23 is disposed to surround the mirror portion 20 and the first actuator 21. The second actuator 22 is disposed to surround the mirror portion 20, the first actuator 21, and the support frame 23. The support frame 23 is not an essential component of the technology of the present disclosure.

The first support portion 24 connects the mirror portion 20 and the first actuator 21 on the first axis $a_1$, and swingably supports the mirror portion 20 around the first axis $a_1$. The first axis $a_1$ is located in a plane including the reflecting surface 20A in a case in which the mirror portion 20 is stationary. For example, the first support portion 24 is a torsion bar stretched along the first axis $a_1$. In addition, the first support portion 24 is connected to the support frame 23 on the first axis $a_1$.

The second support portion 25 connects the first actuator 21 and the second actuator 22 on the second axis $a_2$, and swingably supports the mirror portion 20 and the first actuator 21 around the second axis $a_2$. The second axis $a_2$ is orthogonal to the first axis $a_1$ in the plane including the reflecting surface 20A in a case in which the mirror portion 20 is stationary. The second support portion 25 is connected to the support frame 23 and the fixed portion 26 on the second axis $a_2$.

The fixed portion 26 is connected to the second actuator 22 by the second support portion 25. The fixed portion 26 has a rectangular outer shape and surrounds the second actuator 22. Lengths of the fixed portion 26 in the X direction and the Y direction are, for example, about 1 mm to 10 mm, respectively. A thickness of the fixed portion 26 in the Z direction is, for example, about 5 μm to 0.2 mm.

The first actuator 21 and the second actuator 22 are piezoelectric actuators each comprising a piezoelectric element. The first actuator 21 applies rotational torque around the first axis $a_1$ to the mirror portion 20. The second actuator 22 applies rotational torque around the second axis $a_2$ to the mirror portion 20 and the first actuator 21. Thereby, the mirror portion 20 swings around the first axis $a_1$ and the second axis $a_2$.

The first actuator 21 is an annular thin plate member that surrounds the mirror portion 20 in an XY plane. The first actuator 21 is composed of a pair of a first movable portion 21A and a second movable portion 21B. Each of the first movable portion 21A and the second movable portion 21B is semi-annular. The first movable portion 21A and the second movable portion 21B have a shape that is line-symmetrical with respect to the first axis $a_1$, and are connected on the first axis $a_1$.

The support frame 23 is an annular thin plate member that surrounds the mirror portion 20 and the first actuator 21 in the XY plane.

The second actuator 22 is an annular thin plate member that surrounds the mirror portion 20, the first actuator 21, and the support frame 23 in the XY plane. The second actuator 22 is composed of a pair of a first movable portion 22A and a second movable portion 22B. Each of the first movable portion 22A and the second movable portion 22B is semi-annular. The first movable portion 22A and the second movable portion 22B have a shape that is line-symmetrical with respect to the second axis $a_2$, and are connected on the second axis $a_2$.

In the first actuator 21, the first movable portion 21A and the second movable portion 21B are provided with a piezoelectric element 27A and a piezoelectric element 27B, respectively. In addition, in the second actuator 22, the first movable portion 22A and the second movable portion 22B are provided with a piezoelectric element 28A and a piezoelectric element 28B, respectively.

In FIGS. 3 and 4, a wiring line and an electrode pad for providing the driving signal to the piezoelectric elements 27A, 27B, 28A, and 28B are not shown. A plurality of the electrode pads are provided on the fixed portion 26.

As shown in FIGS. 5 and 6, the MMD 2 is formed, for example, by performing an etching treatment on a silicon on insulator (SOI) substrate 30. The SOI substrate 30 is a substrate in which a silicon oxide layer 32 is provided on a first silicon active layer 31 made of single crystal silicon, and a second silicon active layer 33 made of single crystal silicon is provided on the silicon oxide layer 32.

The mirror portion 20, the first actuator 21, the second actuator 22, the support frame 23, the first support portion 24, and the second support portion 25 are formed of the second silicon active layer 33 remaining by removing the first silicon active layer 31 and the silicon oxide layer 32 from the SOI substrate 30 by an etching treatment. The second silicon active layer 33 functions as an elastic portion having elasticity. The fixed portion 26 is formed of three layers of the first silicon active layer 31, the silicon oxide layer 32, and the second silicon active layer 33.

The piezoelectric elements 27A, 27B, 28A, and 28B have a laminated structure in which a lower electrode 51, a piezoelectric film 52, and an upper electrode 53 are sequentially laminated on the second silicon active layer 33. An insulating film is provided on the upper electrode 53, but is not shown.

The upper electrode 53 and the lower electrode 51 are formed of, for example, gold (Au) or platinum (Pt). The piezoelectric film 52 is formed of, for example, lead zirconate titanate (PZT), which is a piezoelectric material. The upper electrode 53 and the lower electrode 51 are electrically connected to the driving controller 4 described above via the wiring line and the electrode pad.

A driving voltage is applied to the upper electrode 53 from the driving controller 4. The lower electrode 51 is connected to the driving controller 4 via the wiring line and the electrode pad, and a reference potential (for example, a ground potential) is applied thereto.

In a case in which a positive or negative voltage is applied to the piezoelectric film 52 in the polarization direction, deformation (for example, expansion and contraction) proportional to the applied voltage occurs. That is, the piezoelectric film 52 exerts a so-called inverse piezoelectric effect. The piezoelectric film 52 exerts an inverse piezoelectric effect by applying a driving voltage from the driving controller 4 to the upper electrode 53, and displaces the first actuator 21 and the second actuator 22.

Figure 7:
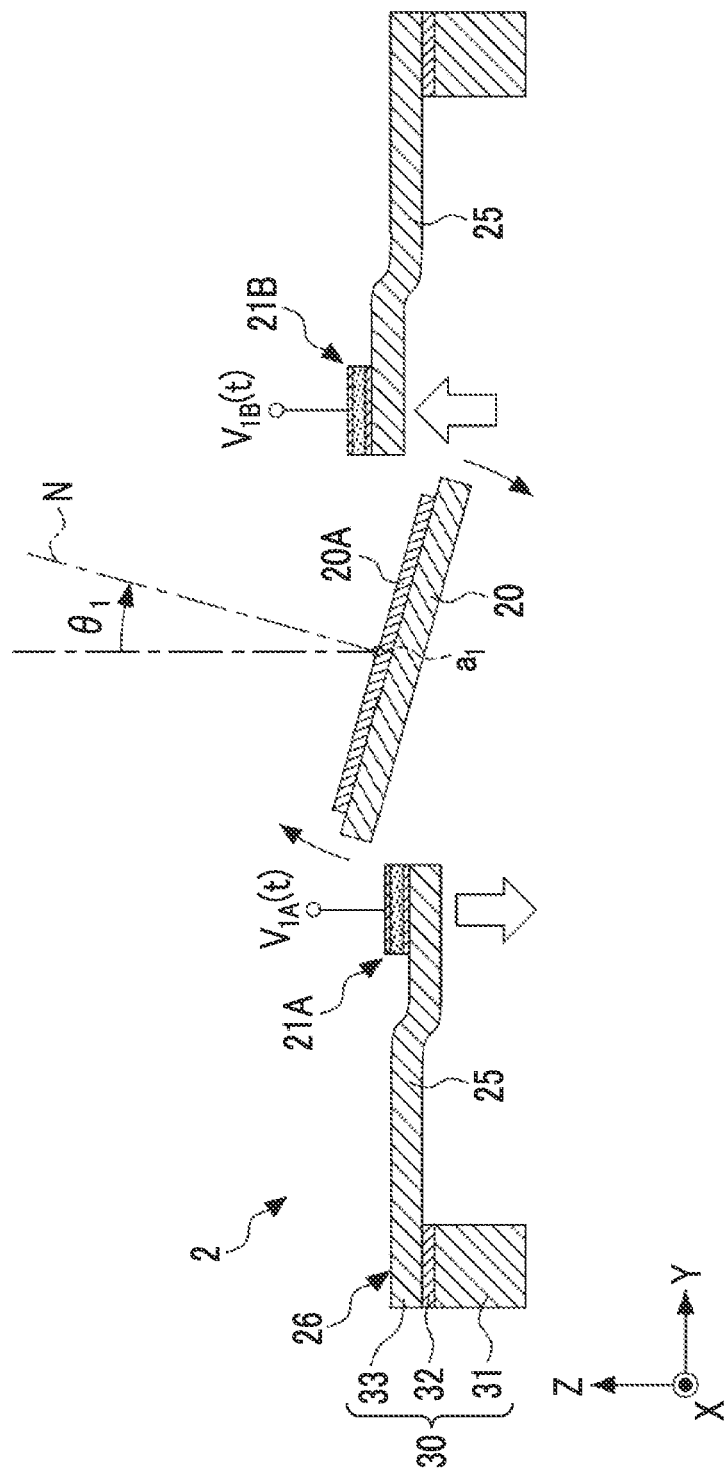
FIG. 7 is a diagram showing an example in which a first actuator is driven in an anti-phase resonance mode.

FIG. 7 shows a state in which the first actuator 21 is driven by extending one of the piezoelectric films 52 of the first movable portion 21A and the second movable portion 21B and contracting the other piezoelectric film 52. In this way, the first movable portion 21A and the second movable portion 21B are displaced in opposite directions to each other, whereby the mirror portion 20 rotates around the first axis $a_1$.

FIG. 7 shows an example in which the first actuator 21 is driven in an anti-phase resonance mode in which the displacement direction of the first movable portion 21A and the second movable portion 21B and the rotation direction of the mirror portion 20 are opposite to each other. In FIG. 7, the first movable portion 21A is displaced in the −Z direction and the second movable portion 21B is displaced in the +Z direction, so that the mirror portion 20 rotates in the +Y direction. The first actuator 21 may be driven in an in-phase resonance mode in which the displacement direction of the first movable portion 21A and the second movable portion 21B and the rotation direction of the mirror portion 20 are the same direction.

An angle at which a normal line N of the reflecting surface 20A of the mirror portion 20 is inclined in the YZ plane is called a first deflection angle $\theta_1$. In a case in which the normal line N of the reflecting surface 20A is inclined in the +Y direction, the first deflection angle $\theta_1$ takes a positive value, and in a case in which it is inclined in the −Y direction, the first deflection angle $\theta_1$ takes a negative value.

The first deflection angle $\theta_1$ is controlled by the driving signal (hereinafter, referred to as a first driving signal) provided to the first actuator 21 by the driving controller 4. The first driving signal is, for example, a sinusoidal AC voltage. The first driving signal includes a driving voltage waveform $V_{1A}(t)$ applied to the first movable portion 21A and a driving voltage waveform $V_{1B}(t)$ applied to the second movable portion 21B. The driving voltage waveform $V_{1A}(t)$ and the driving voltage waveform $V_{1B}(t)$ are in an anti-phase with each other (that is, the phase difference is 180°).

Figure 8:
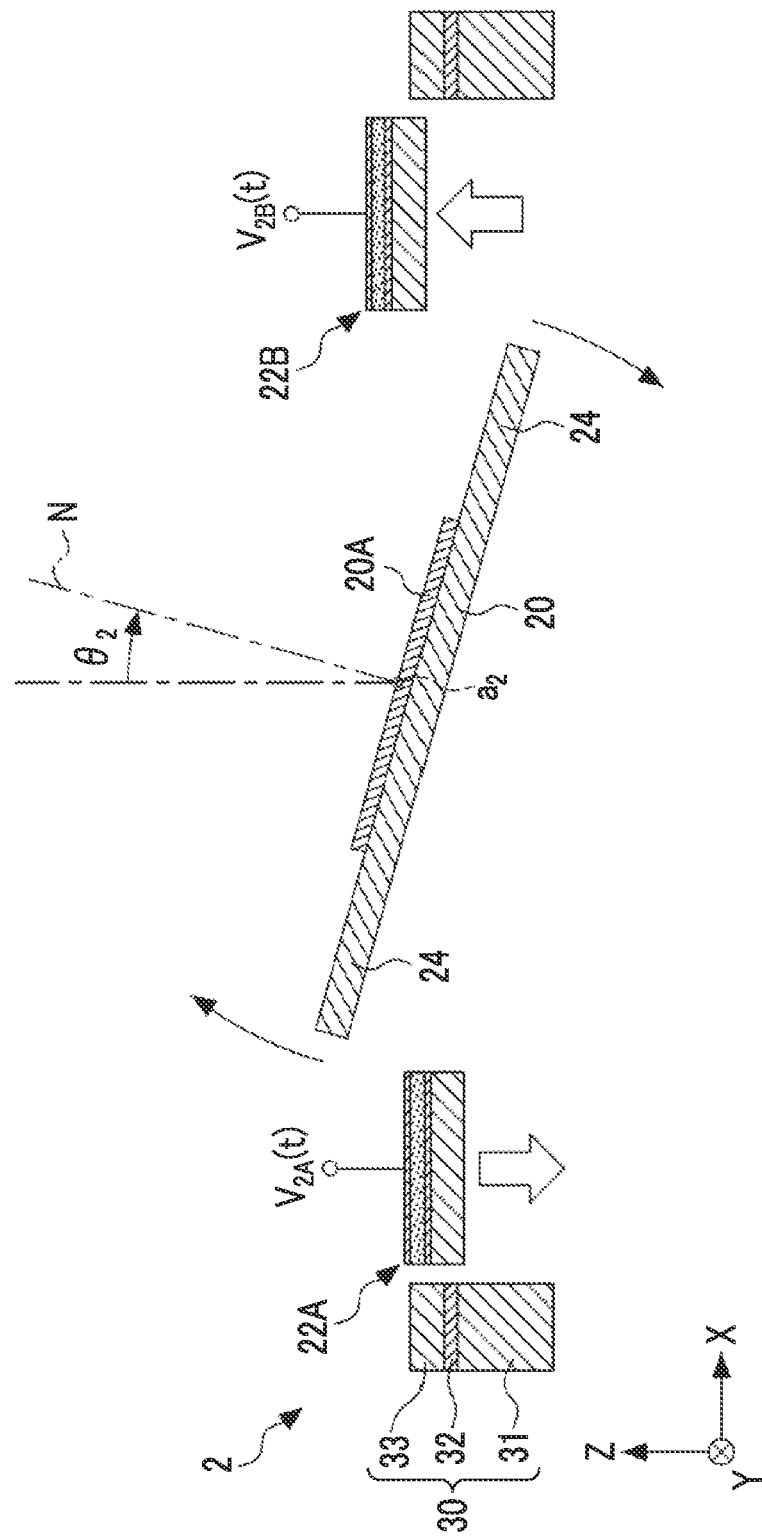
FIG. 8 is a diagram showing an example in which a second actuator is driven in an anti-phase resonance mode.

FIG. 8 shows an example in which the second actuator 22 is driven in an anti-phase resonance mode in which the displacement direction of the first movable portion 22A and the second movable portion 22B and the rotation direction of the mirror portion 20 are opposite to each other. In FIG. 8, the first movable portion 22A is displaced in the −Z direction and the second movable portion 22B is displaced in the +Z direction, so that the mirror portion 20 rotates in the +X direction. The second actuator 22 may be driven in an in-phase resonance mode in which the displacement direction of the first movable portion 22A and the second movable portion 22B and the rotation direction of the mirror portion 20 are the same direction.

An angle at which the normal line N of the reflecting surface 20A of the mirror portion 20 is inclined in the XZ plane is called a second deflection angle $\theta_2$. In a case in which the normal line N of the reflecting surface 20A is inclined in the +X direction, the second deflection angle $\theta_2$ takes a positive value, and in a case in which it is inclined in the −X direction, the second deflection angle $\theta_2$ takes a negative value.

The second deflection angle $\theta_2$ is controlled by the driving signal (hereinafter, referred to as a second driving signal) provided to the second actuator 22 by the driving controller 4. The second driving signal is, for example, a sinusoidal AC voltage. The second driving signal includes a driving voltage waveform $V_{2A}(t)$ applied to the first movable portion 22A and a driving voltage waveform $V_{2B}(t)$ applied to the second movable portion 22B. The driving voltage waveform $V_{2A}(t)$ and the driving voltage waveform $V_{2B}(t)$ are in an anti-phase with each other (that is, the phase difference is 180°).

Figure 9:
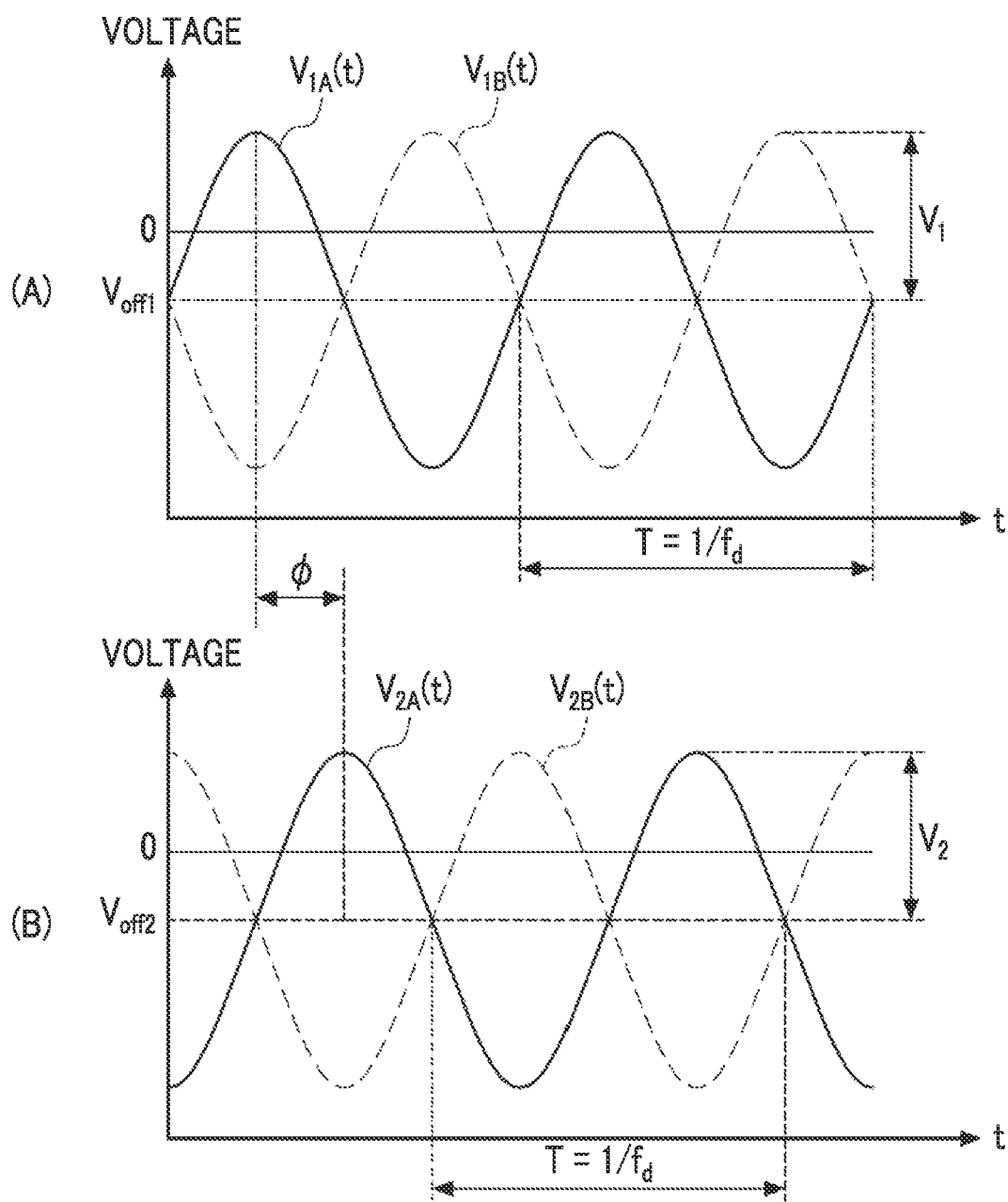
FIG. 9 is a diagram showing an example of a driving signal provided to the first actuator and the second actuator.

FIG. 9 shows an example of a driving signal provided to the first actuator 21 and the second actuator 22. (A) of FIG. 9 shows the driving voltage waveforms $V_{1A}(t)$ and $V_{1B}(t)$ included in the first driving signal. (B) of FIG. 9 shows the driving voltage waveforms $V_{2A}(t)$ and $V_{2B}(t)$ included in the second driving signal.

The driving voltage waveforms $V_{1A}(t)$ and $V_{1B}(t)$ are represented as follows, respectively.

$$V_{1A}(t) = V_{off1} + V_1 \sin(2\pi f_d t)$$

$$V_{1B}(t) = V_{off1} + V_1 \sin(2\pi f_d t + \alpha)$$

Here, $V_1$ is the amplitude voltage. $V_{off1}$ is the bias voltage. $f_d$ is the driving frequency. t is time. $\alpha$ is the phase difference between the driving voltage waveforms $V_{1A}(t)$ and $V_{1B}(t)$. In the present embodiment, for example, $\alpha = 180°$.

By applying the driving voltage waveforms $V_{1A}$ (t) and $V_{1B}$ (t) to the first movable portion 21A and the second movable portion 21B, the mirror portion 20 swings around the first axis $a_1$ (see FIG. 7).

The driving voltage waveforms $V_{2A}$ (t) and $V_{2B}$ (t) are represented as follows, respectively.

$$V_{2A}(t)=V_{off2}+V_2 \sin(2\pi f_d t+\varphi)$$

$$V_{2B}(t)=V_{off2}+V_2 \sin(2\pi f_d t+\beta+\varphi)$$

Here, $V_2$ is the amplitude voltage. $V_{off2}$ is the bias voltage. $f_d$ is the driving frequency. t is time. $\beta$ is the phase difference between the driving voltage waveforms $V_{2A}$ (t) and $V_{2B}$ (t). In the present embodiment, for example, $\beta=180°$. In addition, $\varphi$ is the phase difference between the driving voltage waveforms $V_{1A}$ (t) and $V_{1B}$ (t) and the driving voltage waveforms $V_{2A}$ (t) and $V_{2B}$ (t). In the present embodiment, $\varphi=90°$ is set in order to cause the mirror portion 20 to perform precession.

The bias voltages $V_{off1}$ and $V_{off2}$ are DC voltages for determining a state where the mirror portion 20 is stationary. In a state where the mirror portion 20 is stationary, a plane including the reflecting surface 20A may not be parallel to an upper surface of the fixed portion 26 and may be inclined with respect to the upper surface of the fixed portion 26.

By applying the driving voltage waveforms $V_{2A}$ (t) and $V_{2B}$ (t) to the first movable portion 22A and the second movable portion 22B, the mirror portion 20 swings around the second axis $a_2$ (see FIG. 8).

Figure 10:
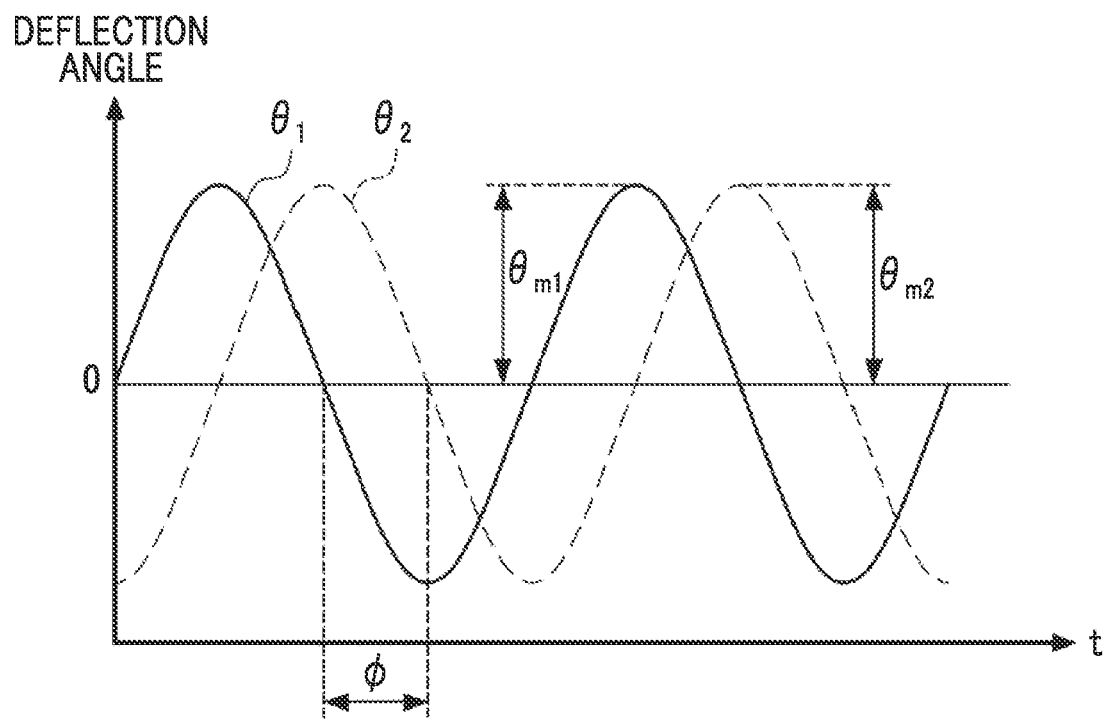
FIG. 10 is a diagram illustrating a time change of a maximum deflection angle.

As described above, the first driving signal and the second driving signal have the same driving frequency $f_d$ and a phase difference of 90°. In order to cause the mirror portion 20 to perform precession, as shown in FIG. 10, it is necessary to set the amplitude voltages $V_1$ and $V_2$ appropriately such that the maximum deflection angle $\theta_{m1}$ of the first deflection angle $\theta_1$ matches the maximum deflection angle $\theta_{m2}$ of the second deflection angle $\theta_2$. This is because a relationship between the amplitude voltage $V_1$ and the first deflection angle $\theta_1$ and a relationship between the amplitude voltage $V_2$ and the second deflection angle $\theta_2$ are not the same. In the description of the present specification, the meaning of "match" includes not only the meaning of perfect match but also the meaning of substantial match including allowable errors in design and manufacturing.

Hereinafter, the maximum deflection angle $\theta_{m1}$ of the first deflection angle $\theta_1$ is referred to as a first maximum deflection angle $\theta_{m1}$. The maximum deflection angle $\theta_{m2}$ of the second deflection angle $\theta_2$ is referred to as a second maximum deflection angle $\theta_{m2}$. Further, in a case in which the first maximum deflection angle $\theta_{m1}$ and the second maximum deflection angle $\theta_{m2}$ are not distinguished, it is simply referred to as a maximum deflection angle $\theta_m$.

Figure 11:
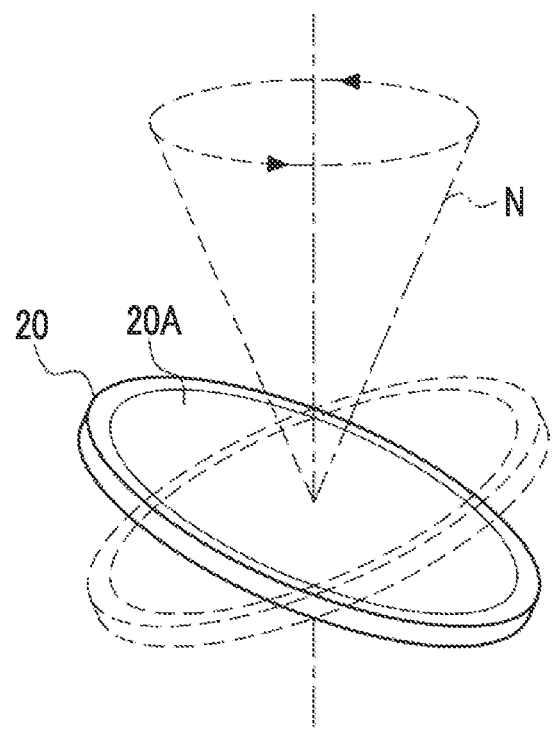
FIG. 11 is a diagram illustrating precession of a mirror portion.

In order to cause the mirror portion 20 to perform precession with high accuracy, it is necessary to appropriately set the driving frequency $f_d$. FIG. 11 shows the precession of the mirror portion 20. The precession is a motion in which the normal line N of the reflecting surface 20A of the mirror portion 20 is deflected such that a circle is drawn. By irradiating the mirror portion 20 performing the precession with the light beam L from the light source 3, the surface to be scanned 5 can be scanned with the light beam L such that a circle is drawn on the surface to be scanned 5.

Figure 12:
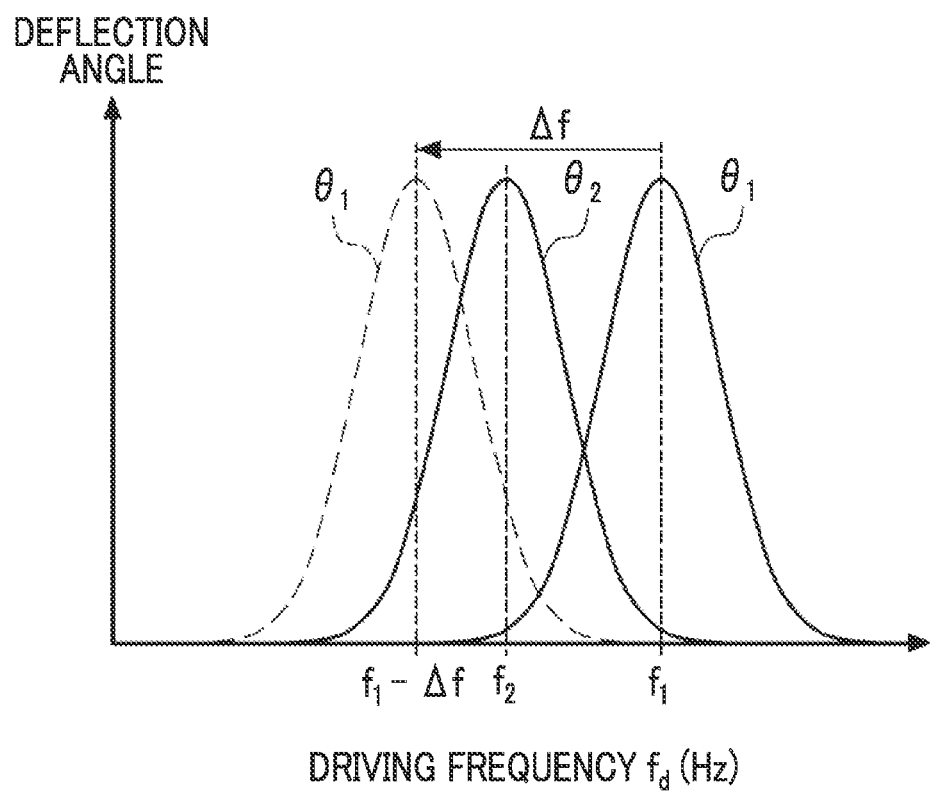
FIG. 12 is a diagram schematically showing a relationship between a deflection angle and a driving frequency.

FIG. 12 schematically shows an example of a relationship between the deflection angle of the mirror portion 20 and the driving frequency $f_d$. The mirror portion 20 vibrates around the first axis $a_1$ and the second axis $a_2$ at a natural vibration frequency. The mirror portion 20 resonates in a case in which the driving frequency $f_d$ matches the natural vibration frequency.

In FIG. 12, $f_1$ represents a resonance frequency (hereinafter, referred to as a first resonance frequency) around the first axis $a_1$ of the mirror portion 20. $f_2$ represents a resonance frequency (hereinafter, referred to as a second resonance frequency) around the second axis $a_2$ of the mirror portion 20. The first resonance frequency $f_1$ is a resonance frequency in a case in which the mirror portion 20 swings only around the first axis $a_1$ without swinging around the second axis $a_2$. The second resonance frequency $f_2$ is a resonance frequency in a case in which the mirror portion 20 swings only around the second axis $a_2$ without swinging around the first axis $a_1$.

A plurality of resonance modes exist for the swing of the mirror portion 20 in addition to the phase (in-phase or anti-phase) with the movable portion described above. For example, the first resonance frequency $f_1$ and the second resonance frequency $f_2$ are in an anti-phase and are resonance frequencies in the lowest order (that is, the lowest frequency) resonance mode.

The closer the driving frequency $f_d$ is to the first resonance frequency $f_1$, the larger the first deflection angle $\theta_1$ is. In addition, the closer the driving frequency $f_d$ is to the second resonance frequency $f_2$, the larger the second deflection angle $\theta_2$ is. Therefore, in general, by matching the first resonance frequency $f_1$ with the second resonance frequency $f_2$ and matching the driving frequency $f_d$ with the first resonance frequency $f_1$ and the second resonance frequency $f_2$, the responsiveness of the deflection angle to the driving signal is improved. The first resonance frequency $f_1$ and the second resonance frequency $f_2$ can be set by adjusting an inertial moment, a spring constant, and the like of the components of the MMD 2 in terms of design.

However, in a case in which the first resonance frequency $f_1$ is matched with the second resonance frequency $f_2$, it is considered that there is an adverse effect that the crosstalk increases. The crosstalk is caused by the fact that propagation of vibration generated in one of the first actuator 21 and the second actuator 22 to the other excites resonance vibration. In a case in which the first resonance frequency $f_1$ is matched with the second resonance frequency $f_2$, an influence of the crosstalk is greatly exerted, particularly in a case in which the maximum deflection angle $\theta_m$ of the mirror portion 20 is small, that is, in a case in which the driving signal is small.

In the MMD 2 of the present embodiment, the first actuator 21 allows the mirror portion 20 to swing around the first axis $a_1$ and the second actuator 22 allows the first actuator 21 to swing around the second axis $a_2$ together with the mirror portion 20. In this way, in a case in which the mirror portion 20 is allowed to swing around the second axis $a_2$, the first actuator 21 also swings around the second axis $a_2$, so that a vibration component around the second axis $a_2$ propagates to the first axis $a_1$, which affects a change in voltage characteristics of the first actuator 21 and the first resonance frequency $f_1$. The present applicant confirmed that the first resonance frequency $f_1$ shifts in a case in which the mirror portion 20 swings around the first axis $a_1$ and around the second axis $a_2$ simultaneously. Hereinafter, this shift amount will be denoted by $\Delta f$.

In order to avoid the crosstalk, it is preferable that the first resonance frequency $f_1$ is not matched with the second resonance frequency $f_2$. In addition, a magnitude relationship between the first resonance frequency $f_1$ and the second resonance frequency $f_2$ needs to be determined in consideration of the shift amount Δf. This is because the shift amount Δf changes depending on a magnitude of the maximum deflection angle $θ_m$ of the mirror portion 20.

Figure 13:
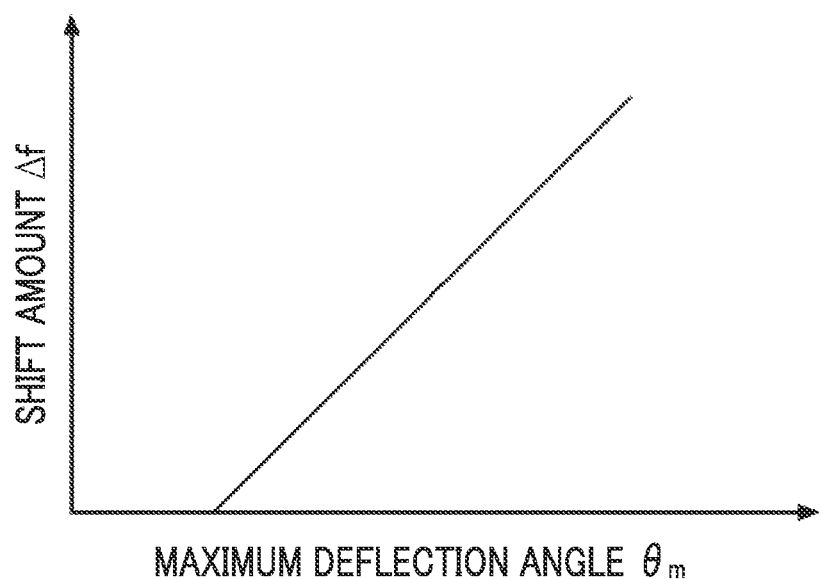
FIG. 13 is a diagram showing an example of a change in a shift amount with respect to a maximum deflection angle.

FIG. 13 shows an example of a change in the shift amount Δf with respect to the maximum deflection angle $θ_m$ of the mirror portion 20. The present applicant measured the shift amount Δf of the first resonance frequency $f_1$ with respect to the maximum deflection angle $θ_m$ in a case in which the surface to be scanned 5 was scanned with the light beam L such that a positive circle is drawn on the surface to be scanned 5 by causing the mirror portion 20 to perform precession. A size of the circle scanned on the surface to be scanned 5 is proportional to the maximum deflection angle θm.

As shown in FIG. 13, it was confirmed that the shift amount Δf of the first resonance frequency $f_1$ increased as the maximum deflection angle $θ_m$ increased. Here, the shift amount Δf was a positive value (that is, Δf>0).

The present applicant found that the deflection angle can be improved with low power in a case in which the first resonance frequency $f_1$ and the second resonance frequency $f_2$ satisfy a relationship of "$f_2<f_1$" and the driving frequency $f_d$ satisfies a relationship of "$f_d≤f_1$".

For example, in a case in which the optical scanning device 10 is applied to the LiDAR device, a radius of a circle scanned on the surface to be scanned 5 by the light beam L (hereinafter, referred to as a scanning radius) is controlled. This scanning radius corresponds to the maximum deflection angle $θ_m$ of the mirror portion 20. The first maximum deflection angle $θ_{m1}$ depends on the amplitude voltage $V_1$ of the first driving signal. The second maximum deflection angle $θ_{m2}$ depends on the amplitude voltage $V_2$ of the second driving signal. In order to obtain a scanning radius having a sufficient size, it is preferable that the maximum deflection angle $θ_m$ is 10° or more. In addition, in order to reduce the power consumption, it is preferable that the amplitude voltage $V_1$ and the amplitude voltage $V_2$ are each less than 40 V.

The measurement results of the maximum deflection angle $θ_m$ of the mirror portion 20 and the amplitude voltages $V_1$ and $V_2$ are shown below. The present applicant measured the maximum deflection angle $θ_m$ for each of the following five cases: a case in which the driving frequency $f_d$ is set in a range of $f_d<f_1-Δf$; a case in which the driving frequency $f_d$ is set in a range of $f_1-Δf<f_d<f_2$; a case in which the driving frequency $f_d$ is set in a range of $f_1=f_2$, a case in which the driving frequency $f_d$ is set in a range of $f_2<f_d≤f_1$; and a case where the driving frequency $f_d$ is set in a range of $f_1<f_d$.

Specifically, the present applicant measured a relationship between the amplitude voltages $V_1$ and $V_2$ with respect to the radius of the circle (scanning radius) in a case in which the surface to be scanned 5 was scanned with the light beam L such that a positive circle is drawn on the surface to be scanned 5 by causing the mirror portion 20 to perform precession. The surface to be scanned 5 was provided with gradations at intervals of 1 mm, and the maximum deflection angle $θ_m$ was measured based on a measured value of a shape and size of the circle using the gradations. The MMD 2 used in this measurement has $f_1$=1237 Hz and $f_2$=1230 Hz, and satisfies the relationship of $f_2<f_1$.

Figure 14:
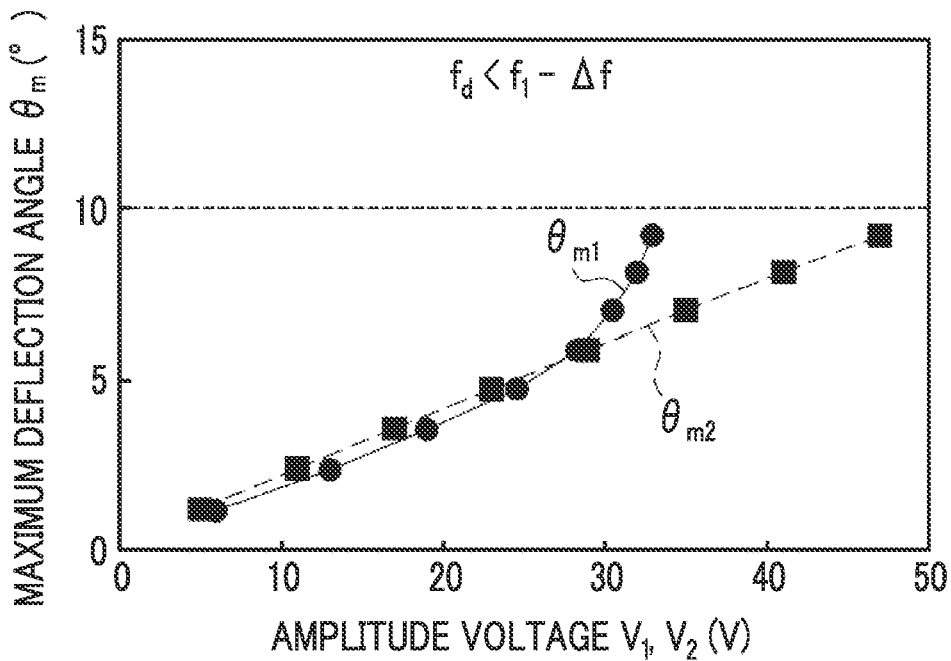
FIG. 14 is a diagram showing a measurement result of a maximum deflection angle in a case in which a driving frequency $f_d$ is set in a range of $f_d < f_1 - \Delta f$.

FIG. 14 shows a measurement result of the maximum deflection angle $θ_m$ in a case where the driving frequency $f_d$ is set in a range of $f_d<f_1-Δf$. Here, $f_d=f_1-25$ Hz. In FIG. 14, it can be seen that $θ_{m1}≥10°$ in a case of $V_1≥33$ V and $θ_{m2}≥10°$ in a case of $V_2≥50$ V.

Figure 15:
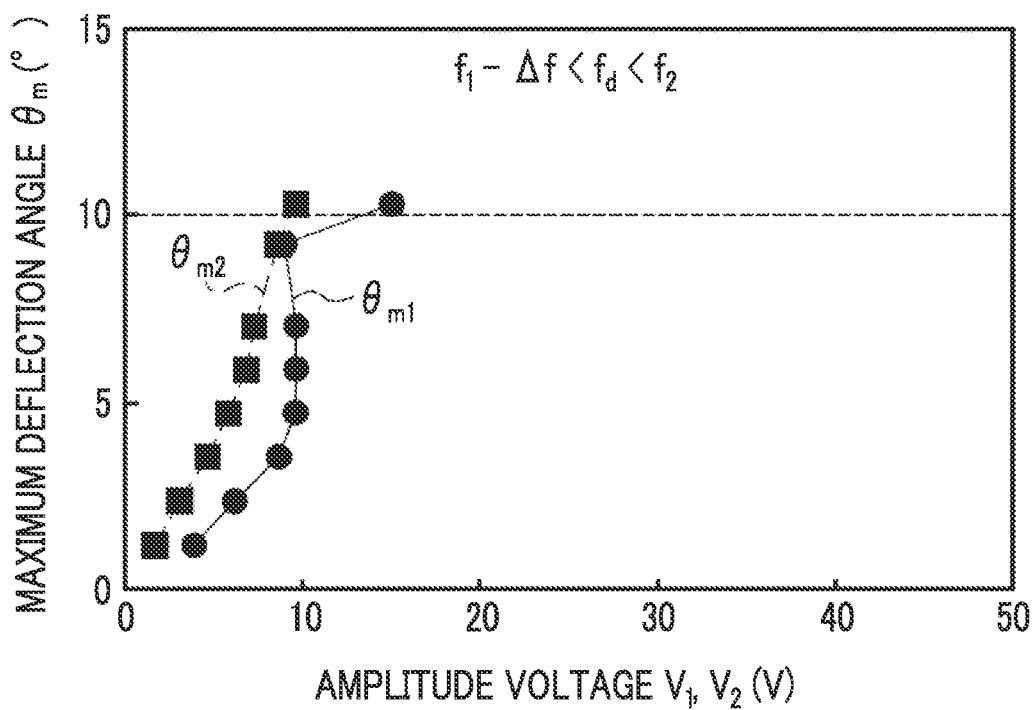
FIG. 15 is a diagram showing a measurement result of a maximum deflection angle in a case in which the driving frequency $f_d$ is set in a range of $f_1 - \Delta f < f_d < f_2$.

FIG. 15 shows a measurement result of the maximum deflection angle $θ_m$ in a case in which the driving frequency $f_d$ is set in a range of $f_1-Δf<f_d<f_2$. In FIG. 15, it can be seen that $θ_{m1}≥10°$ in a case of $V_1≥15$ V and $θ_{m2}≥10°$ in a case of $V_2≥9$ V.

Figure 16:
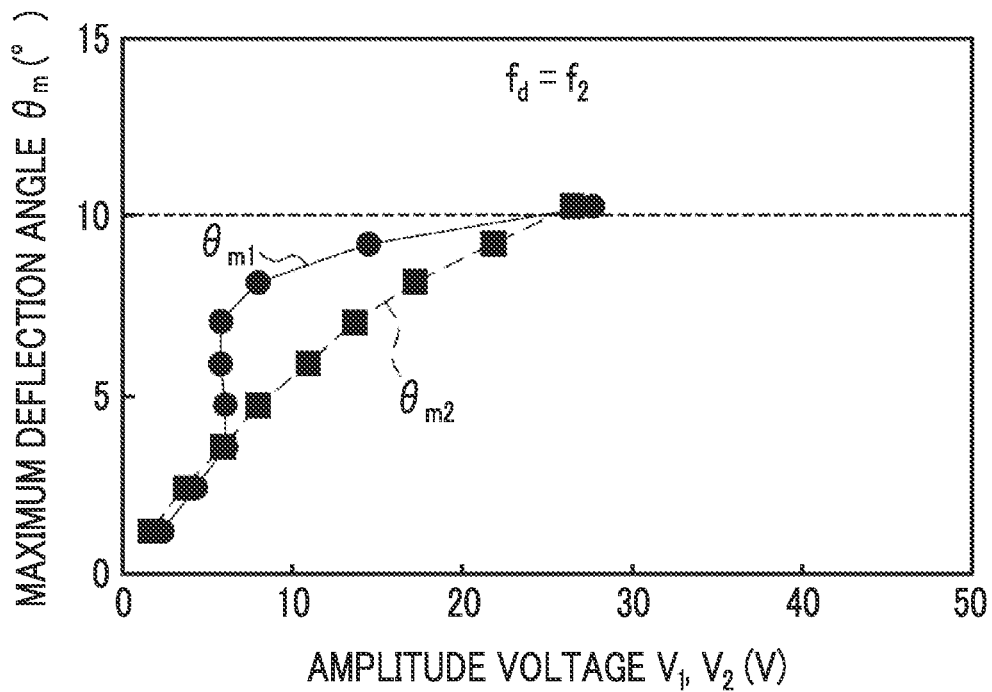
FIG. 16 is a diagram showing a measurement result of a maximum deflection angle in a case in which the driving frequency $f_d$ is set as $f_d = f_2$.

FIG. 16 shows a measurement result of the maximum deflection angle $θ_m$ in a case in which the driving frequency $f_d$ is set as $f_d=f_2$. In FIG. 16, it can be seen that $θ_{m1}≥10°$ in a case of $V_1≥28$ V and $θ_{m2}≥10°$ in a case of $V_2≥29$ V.

Figure 17:
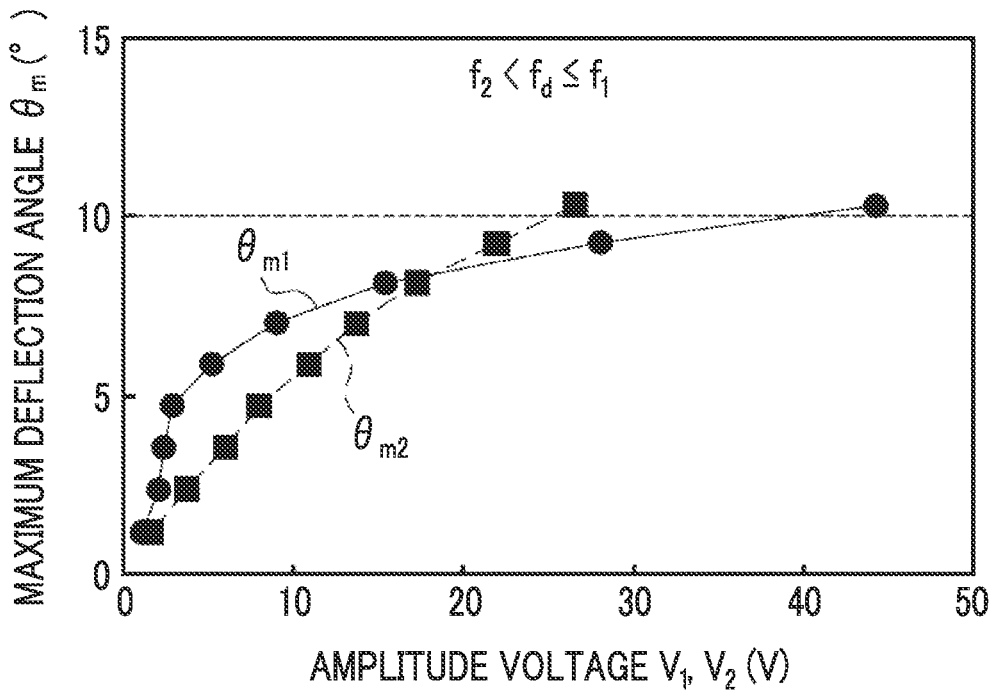
FIG. 17 is a diagram showing a measurement result of a maximum deflection angle in a case in which the driving frequency $f_d$ is set in a range of $f_2 < f_d \leq f_1$.

FIG. 17 shows a measurement result of the maximum deflection angle $θ_m$ in a case in which the driving frequency $f_d$ is set in a range of $f_2<f_d≤f_1$. In FIG. 17, it can be seen that $θ_{m1}≥10°$ in a case of $V_1≥40$ V and $θ_{m2}≥10°$ in a case of $V_2≥25$ V.

Figure 18:
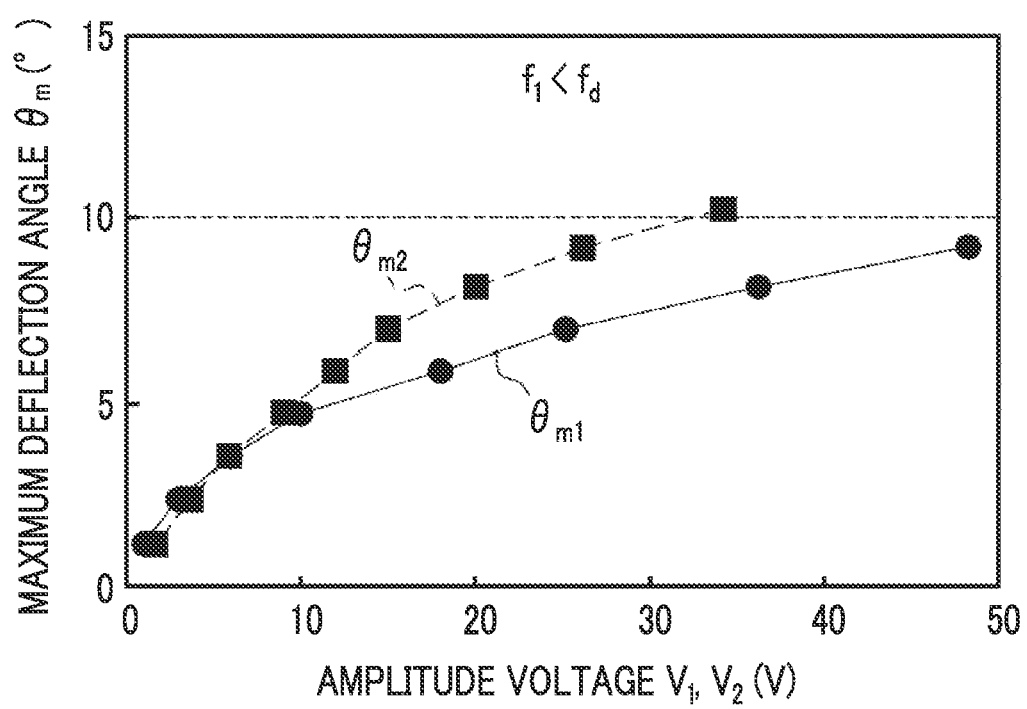
FIG. 18 is a diagram showing a measurement result of a maximum deflection angle in a case in which the driving frequency $f_d$ is set in a range of $f_1 < f_d$.

FIG. 18 shows a measurement result of the maximum deflection angle $θ_m$ in a case in which the driving frequency $f_d$ is set in a range of $f_1<f_d$. In FIG. 17, it can be seen that $θ_{m1}≥10°$ in a case of $V_1≥50$ V and $θ_{m2}≥10°$ in a case of $V_2≥32$ V.

As described above, it can be seen that it is preferable that the driving frequency fa satisfies the relationship of "$f_d≤f_1$" in order to improve the deflection angle with low power. Further, it can be seen that it is more preferable that the driving frequency $f_d$ satisfies a relationship of "$f_1-Δf<f_d<f_2$". That is, it is not preferable that the driving frequency $f_d$ is too far from $f_1-Δf$ and $f_2$, but it is preferable that the driving frequency $f_d$ is within a range between $f_1-Δf$ and $f_2$.

[Adjustment of Resonance Frequency]

Figure 19:
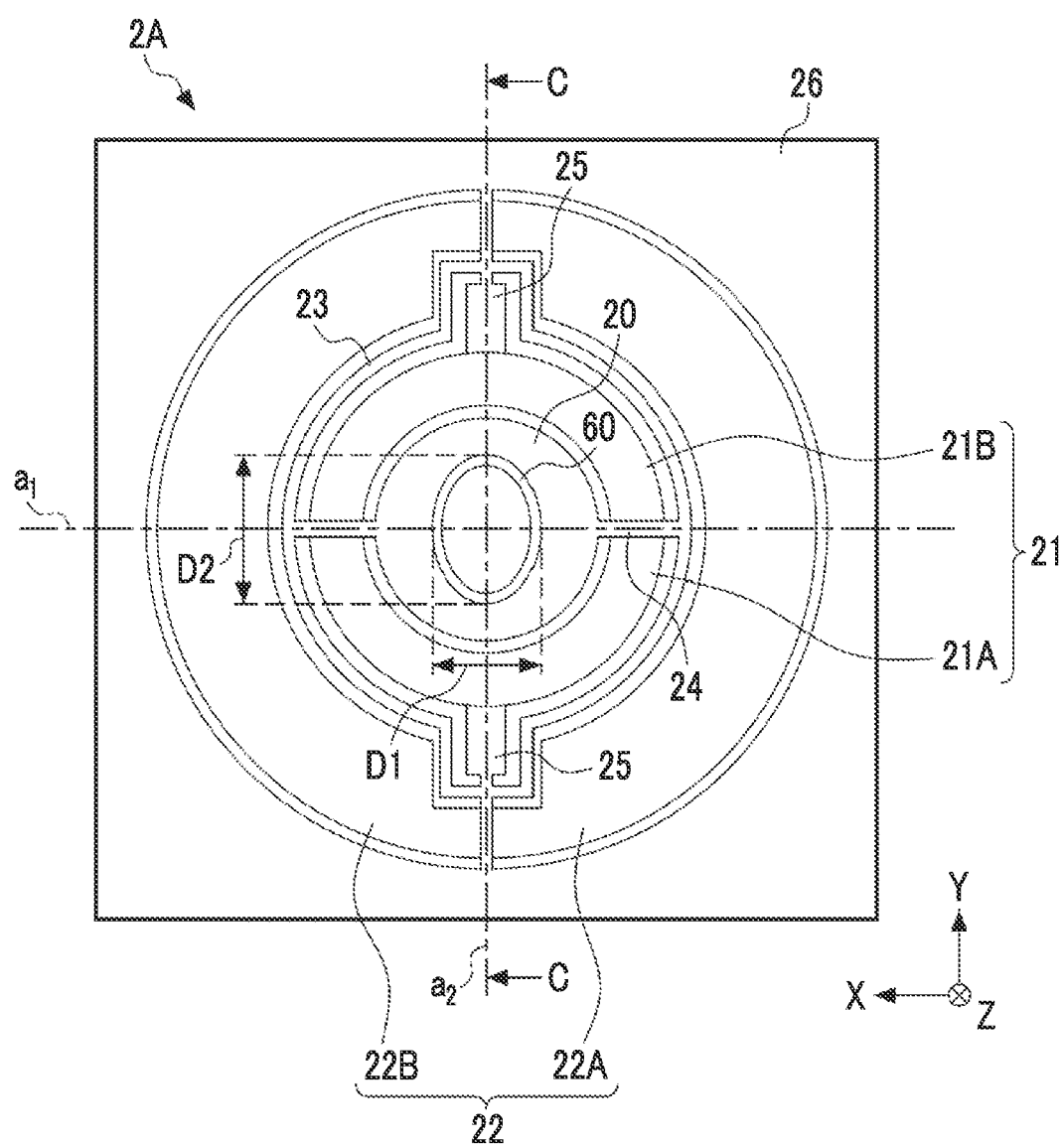
FIG. 19 is a plan view of a micromirror device having a rib as viewed from a back surface side.
Figure 20:
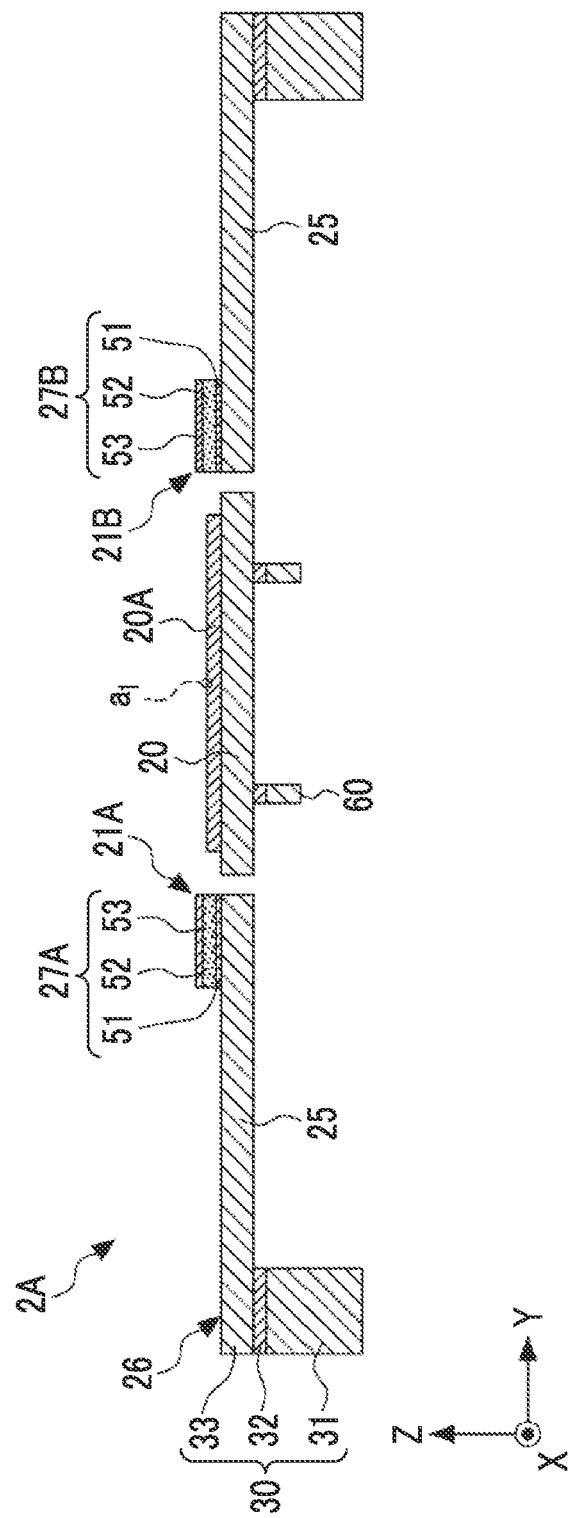
FIG. 20 is a cross-sectional view taken along the line C-C of FIG. 19.

Next, an example of a method of adjusting a relationship between the first resonance frequency $f_1$ and the second resonance frequency $f_2$ will be described. An MMD 2A shown in FIGS. 19 and 20 has a rib 60 on a back surface side (that is, a side opposite to the light incident side) of the mirror portion 20. FIG. 19 is a plan view of the MMD 2A as viewed from the back surface side. FIG. 20 is a cross-sectional view taken along the line C-C of FIG. 19. Other configurations of the MMD 2A are the same as those of the MMD 2 according to the above-described embodiment.

The rib 60 increases the rigidity of the mirror portion 20 to increase the flatness of the reflecting surface 20A formed on the light incident side of the mirror portion 20. The rib 60 is formed by patterning the first silicon active layer 31 and the silicon oxide layer 32 by an etching treatment.

As shown in FIG. 19, in this example, a planar shape of the rib 60 is an elliptical shape in which the center coincides with the center of the mirror portion 20. In this example, in the rib 60, a minor axis is parallel to the first axis $a_1$ and the major axis is parallel to the second axis $a_2$. By changing a length of a minor diameter D1, the moment of inertia around the first axis $a_1$ of the mirror portion 20 changes. In addition, by changing a length of a major diameter D2, the moment of inertia around the second axis $a_2$ of the mirror portion 20 changes. Therefore, by changing a ratio of the minor diameter D1 to the major diameter D2, a ratio of the first resonance frequency $f_1$ to the second resonance frequency $f_2$ can be adjusted to satisfy the relationship of "$f_2<f_1$".

The configurations of the MMD 2 and the MMD 2A shown in the above embodiment can be changed as appropriate. For example, in the above embodiment, although the first actuator 21 and the second actuator 22 have an annular shape, one or both of the first actuator 21 and the second actuator 22 may have a meander structure. In addition, it is possible to use a support member having a configuration other than a torsion bar as the first support portion 24 and the second support portion 25.

The hardware configuration of the driving controller 4 can be variously modified. A processing unit of the driving controller 4 may be configured of one processor, or may be configured of a combination of two or more processors of the same type or different types (for example, a combination of a plurality of field programmable gate arrays (FPGAs) and/or a combination of a CPU and an FPGA).

All documents, patent applications, and technical standards mentioned in this specification are incorporated herein by reference to the same extent as in a case in which each document, each patent application, and each technical standard are specifically and individually described by being incorporated by reference.

What is claimed is:

1. An optical scanning device comprising:
   a micromirror device including a mirror portion that has a reflecting surface for reflecting incident light, a first actuator that allows the mirror portion to swing around a first axis located in a plane including the reflecting surface in a case in which the mirror portion is stationary, and a second actuator that allows the mirror portion to swing around a second axis orthogonal to the first axis in the plane; and
   a processor that causes the mirror portion to perform precession by providing a first driving signal and a second driving signal each having the same driving frequency to the first actuator and the second actuator, respectively,
   wherein, in the micromirror device,
   a relationship of $f_2 < f_1$ is satisfied in a case in which a resonance frequency around the first axis is denoted by $f_1$ and a resonance frequency around the second axis is denoted by $f_2$,
   the resonance frequency around the first axis changes by $\Delta f$ from $f_1$ in a case in which the mirror portion is driven around the first axis and the second axis simultaneously, and
   a relationship of $f_1 - \Delta f < f_d \leq f_1$ is satisfied in a case in which the driving frequency is denoted by $f_d$.

2. The optical scanning device according to claim 1, wherein a relationship of $\Delta f > 0$ is satisfied.

3. The optical scanning device according to claim 2, wherein a relationship of $f_1 - \Delta f < f_d < f_2$ is satisfied.

4. The optical scanning device according to claim 1, wherein the first actuator and the second actuator are piezoelectric actuators each including a piezoelectric element.

5. The optical scanning device according to claim 1, wherein the first actuator is connected to the mirror portion via a first support portion that swingably supports the mirror portion around the first axis, and
   the second actuator is connected to the first actuator via a second support portion that swingably supports the first actuator around the second axis.

6. The optical scanning device according to claim 5, wherein each of the first support portion and the second support portion is a torsion bar.

7. The optical scanning device according to claim 1, further comprising:
   a light source that emits a light beam perpendicularly to the reflecting surface in a case in which the mirror portion is stationary.

8. A method of driving a micromirror device including a mirror portion that has a reflecting surface for reflecting incident light, a first actuator that allows the mirror portion to swing around a first axis located in a plane including the reflecting surface in a case in which the mirror portion is stationary, and a second actuator that allows the mirror portion to swing around a second axis orthogonal to the first axis in the plane,
   wherein, in the micromirror device,
   a relationship of $f_2 < f_1$ is satisfied in a case in which a resonance frequency around the first axis is denoted by $f_1$ and a resonance frequency around the second axis is denoted by $f_2$,
   the resonance frequency around the first axis changes by $\Delta f$ from $f_1$ in a case in which the mirror portion is driven around the first axis and the second axis simultaneously, and
   a first driving signal and a second driving signal each having a driving frequency $f_d$ satisfying a relationship of $f_1 - \Delta f < f_d \leq f_1$ are provided to the first actuator and the second actuator, respectively, to cause the mirror portion to perform precession.

* * * * *